(12) United States Patent
Chen et al.

(10) Patent No.: US 11,901,289 B2
(45) Date of Patent: *Feb. 13, 2024

(54) SEMICONDUCTOR DEVICE STRUCTURE WITH RESISTIVE ELEMENT

(71) Applicant: TAIWAN SEMICONDUCTOR MANUFACTURING COMPANY, LTD., Hsinchu (TW)

(72) Inventors: Wan-Te Chen, New Taipei (TW); Chung-Hui Chen, Hsinchu (TW); Wei-Chih Chen, Hsinchu (TW); Chii-Ping Chen, Hsinchu (TW); Wen-Sheh Huang, Hsinchu (TW); Bi-Ling Lin, Hsinchu (TW); Sheng-Feng Liu, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/848,146

(22) Filed: Jun. 23, 2022

(65) Prior Publication Data
US 2022/0319987 A1 Oct. 6, 2022

Related U.S. Application Data

(63) Continuation of application No. 16/422,101, filed on May 24, 2019, now Pat. No. 11,404,369, which is a
(Continued)

(51) Int. Cl.
H01L 23/522 (2006.01)
H01L 27/06 (2006.01)
(Continued)

(52) U.S. Cl.
CPC ...... *H01L 23/5228* (2013.01); *H01L 23/3677* (2013.01); *H01L 27/0629* (2013.01); *H01L 29/42376* (2013.01); *H01L 29/78* (2013.01)

(58) Field of Classification Search
CPC ............... H01L 23/367; H01L 23/3736; H01L 23/5228; H01L 23/3677; H01L 23/528;
(Continued)

(56) References Cited

U.S. PATENT DOCUMENTS 6,258,713 B1 7/2001 Yu et al.
6,566,171 B1 5/2003 Liu et al.
(Continued)

FOREIGN PATENT DOCUMENTS

CN 1458680 A 11/2003
CN 1551353 A 12/2004
(Continued)

OTHER PUBLICATIONS

U.S. Office Action for U.S. Appl. No. 16/712,199, dated Mar. 22, 2021.
(Continued)

*Primary Examiner* — Thanh Y. Tran
(74) *Attorney, Agent, or Firm* — Birch, Stewart, Kolasch & Birch, LLP

(57) ABSTRACT

A semiconductor device structure is provided. The semiconductor device structure includes a substrate and a resistive element over the substrate. The semiconductor device structure also includes a thermal conductive element over the substrate. A direct projection of the thermal conductive element on a main surface of the resistive element extends across a portion of a first imaginary line and a portion of a second imaginary line of the main surface. The first imaginary line is perpendicular to the second imaginary line, and
(Continued)

the first imaginary line and the second imaginary line intersect at a center of the main surface.

20 Claims, 14 Drawing Sheets

Related U.S. Application Data continuation of application No. 15/599,687, filed on May 19, 2017, now Pat. No. 10,304,772.

(51) Int. Cl.
*H01L 23/367* (2006.01)
*H01L 29/423* (2006.01)
*H01L 29/78* (2006.01)

(58) Field of Classification Search
CPC ............. H01L 23/5226; H01L 23/5283; H01L 23/5381; H01L 23/5386; H01L 24/18–20; H01L 27/0629; H01L 29/42376; H01L 23/535; H01L 29/78; H01L 23/40
See application file for complete search history.

(56) References Cited

U.S. PATENT DOCUMENTS

| | | |
|---|---|---|
| 6,709,918 B1 | 3/2004 | Ng et al. |
| 7,388,291 B2 | 6/2008 | Kurokawa et al. |
| 8,563,336 B2 | 10/2013 | Chen et al. |
| 8,835,306 B2 | 9/2014 | Ryan et al. |
| 9,905,633 B1 | 2/2018 | Yang |
| 10,304,772 B2 * | 5/2019 | Chen .................. H01L 27/0629 |
| 11,404,369 B2 * | 8/2022 | Chen .................. H01L 23/5228 |
| 2004/0227242 A1 | 11/2004 | Noguchi et al. |
| 2006/0202291 A1 | 9/2006 | Kolb et al. |
| 2007/0284662 A1 | 12/2007 | Chinthakind et al. |
| 2008/0237800 A1 | 10/2008 | Chinthakindi et al. |
| 2009/0015369 A1 | 1/2009 | Takeda et al. |
| 2011/0254165 A1 | 10/2011 | Muranaka |
| 2012/0074571 A1 | 3/2012 | Lavoie |
| 2012/0112873 A1 | 5/2012 | Le Neel et al. |
| 2012/0119872 A1 * | 5/2012 | Leung .................. H01C 17/265 427/102 |
| 2012/0146186 A1 | 6/2012 | Lukaitis et al. |
| 2013/0168815 A1 | 7/2013 | Le Neel et al. |
| 2014/0125421 A1 | 5/2014 | Miyazaki |
| 2014/0167070 A1 | 6/2014 | Park et al. |
| 2014/0264748 A1 | 9/2014 | Fujiwara et al. |
| 2015/0221713 A1 | 8/2015 | Li et al. |
| 2016/0204100 A1 | 7/2016 | Zhang et al. |
| 2017/0179033 A1 | 6/2017 | West et al. |
| 2017/0301745 A1 | 10/2017 | Edelstein et al. |
| 2018/0058943 A1 | 3/2018 | Ge et al. |

FOREIGN PATENT DOCUMENTS

| | | |
|---|---|---|
| CN | 102142426 A | 8/2011 |
| CN | 102376708 A | 3/2012 |
| CN | 102800707 A | 11/2012 |
| CN | 104835780 A | 8/2015 |
| CN | 106057772 A | 10/2016 |

OTHER PUBLICATIONS

U.S. Office Action, dated Dec. 11, 2018, for U.S. Appl. No. 15/865,845.
U.S. Office Action, dated Dec. 14, 2018, for U.S. Appl. No. 15/866,022.
U.S. Office Action for U.S. Appl. No. 18/307,197, dated Nov. 24, 2023.

* cited by examiner

SEMICONDUCTOR DEVICE STRUCTURE WITH RESISTIVE ELEMENT

CROSS REFERENCE

This application is a Continuation application of U.S. patent application Ser. No. 16/422,101, filed on May 24, 2019, which is a Continuation application of U.S. patent application Ser. No. 15/599,687, filed on May 19, 2017, the entire of which are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. For example, the effect of electromigration becomes a more important consideration to take into account in applications where high direct current densities are used, especially when the ICs have small feature sizes. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
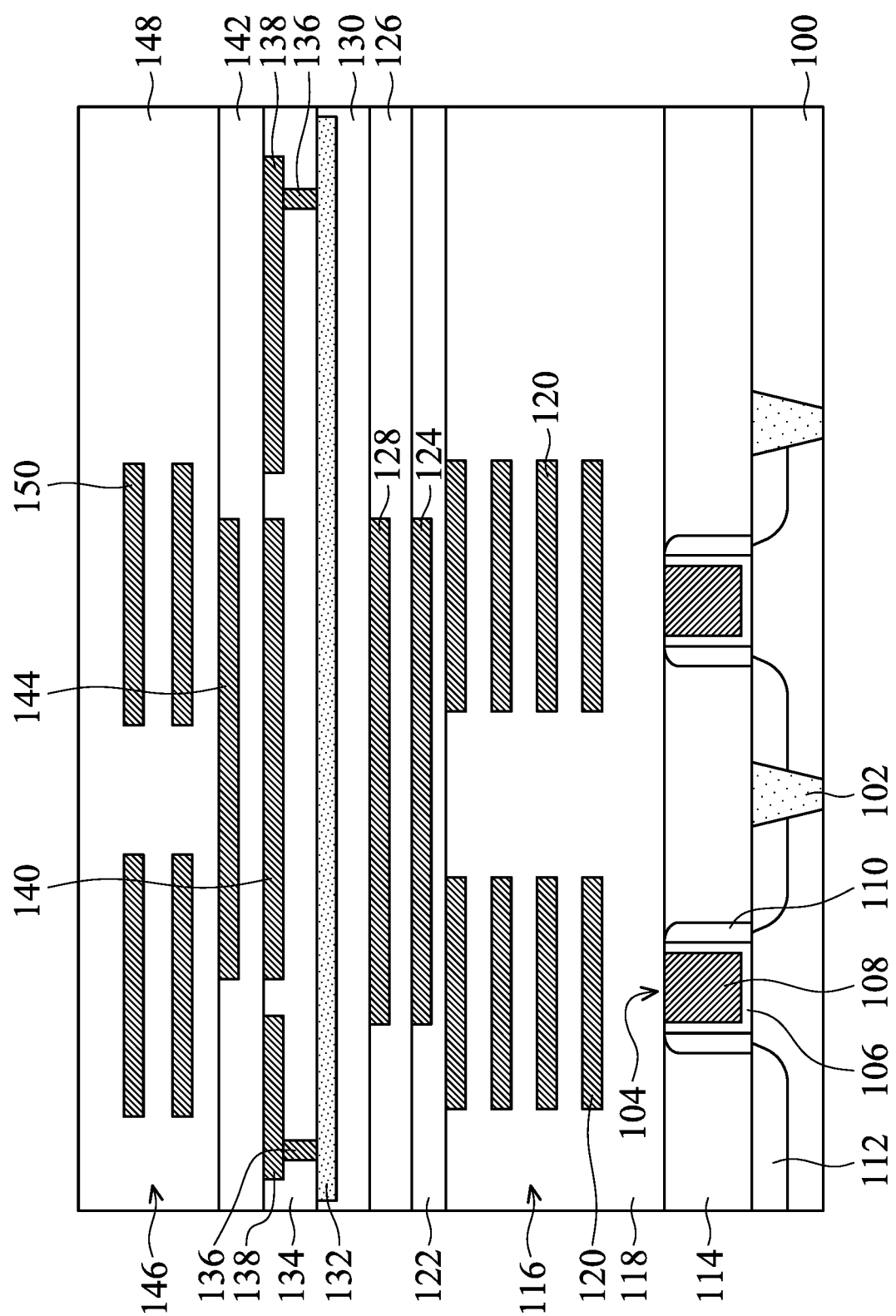
FIG. 1 is a cross-sectional view of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As shown in FIG. 1, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or other elementary semiconductor materials such as germanium. In some other embodiments, the semiconductor substrate 100 includes a compound semiconductor. The compound semiconductor may include gallium arsenide, silicon carbide, indium arsenide, indium phosphide, one or more other suitable compound semiconductors, or a combination thereof.

In some embodiments, isolation features 102 are formed in the semiconductor substrate 100. The isolation features 102 are used to define and/or electrically isolate various device elements formed in and/or over the semiconductor substrate 100. In some embodiments, the isolation features 102 include shallow trench isolation (STI) features, local oxidation of silicon (LOCOS) features, another suitable isolation feature, or a combination thereof. In some embodiments, the isolation features 102 are made of a dielectric material. The dielectric material may include silicon oxide, silicon nitride, silicon oxynitride, fluoride-doped silicate glass (FSG), low-K dielectric material, one or more other suitable materials, or a combination thereof.

As shown in FIG. 1, gate stacks 104 are formed over the semiconductor substrate 100, in accordance with some embodiments. In some embodiments, channel regions are formed or defined under the gate stacks 104, as shown in FIG. 1. The channel regions may be used to provide connecting path for carriers between the source/drain structures that will be formed.

In some embodiments, each of the gate stacks 104 includes a gate dielectric layer 106 and a gate electrode 108. The gate electrode 108 may be made of or include polysilicon, one or more metal materials, one or more other suitable conductive materials, or a combination thereof. In some embodiments, the gate electrode 108 is a metal gate electrode. The metal gate electrode may include one or more work function layers.

The gate dielectric layer 106 may be made of or include silicon oxide, silicon nitride, silicon oxynitride, dielectric material with high dielectric constant (high-K), one or more other suitable dielectric materials, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof.

In some embodiments, spacer elements 110 are formed over sidewalls of the gate stacks 104, as shown in FIG. 1. The spacer elements 110 may be made of silicon nitride, silicon oxynitride, silicon carbide, silicon carbon nitride, one or more other suitable materials, or a combination thereof. The spacer elements 110 may be used to assist in the subsequent formation of source/drain structures 112.

In some embodiments, the source/drain structures 112 are formed in and/or over the semiconductor substrate 100, as shown in FIG. 1A. The source/drain structures 112 are adjacent to the gate stacks 104. The source/drain structures 112 may include doped regions and/or epitaxially grown features.

In some embodiments, a dielectric layer 114 is formed over the semiconductor substrate 100 to surround the gate stacks 104, as shown in FIG. 1. The dielectric layer 114 may be made of or include silicon oxide, silicon nitride, silicon oxynitride, fluoride-doped silicate glass (FSG), carbon-containing dielectric material, low-K dielectric material, one or more other suitable materials, or a combination thereof.

In some embodiments, the dielectric layer 114 is deposited using a chemical vapor deposition (CVD) process, an atomic layer deposition (ALD) process, a physical vapor deposition (PCD) process, a spin-on process, a spray coating process, one or more other applicable processes, or a combination thereof. Afterwards, a planarization process may be used to thin the deposited dielectric layer 114 until the gate stacks 104 are exposed. The planarization process may include a chemical mechanical polishing (CMP) process, a dry polishing process, a mechanical grinding process, an etching process, one or more other applicable processes, or a combination thereof.

Afterwards, an interconnect structure 116 is formed over the dielectric layer 114 and the gate stacks 104, as shown in FIG. 1 in accordance with some embodiments. The interconnect structure 116 may include multiple conductive features including conductive lines 120 and conductive vias (not shown in FIG. 1). The conductive features may be made of or include copper, aluminum, nickel, cobalt, titanium, gold, platinum, one or more other suitable materials, or a combination thereof.

The conductive features are surrounded by a dielectric material 118. In some embodiments, the dielectric material 118 includes multiple dielectric layers. Multiple electrical connections are formed between device elements in or on the semiconductor substrate 100 through the conductive features of the interconnect structure 116. The formation of the interconnect structure 116 may involve multiple deposition processes, photolithography processes, etching processes, planarization processes, one or more other applicable processes, or a combination thereof.

As shown in FIG. 1, a resistive element 132 is formed over the interconnect structure 116, in accordance with some embodiments. In some embodiments, the resistive element 132 is positioned directly above one or more of the gate stacks 104. The resistive element 132 may be used in high-speed circuit applications. In some embodiments, the resistive element 132 is made of or includes titanium nitride, tantalum nitride, one or more other suitable materials, or a combination thereof. The resistive element 132 has a high sheet resistance, which assist in the high-speed operation of semiconductor devices.

In some embodiments, the resistive element 132 is formed on a dielectric layer 130. The material and formation method of the dielectric layer 130 may be similar to or the same as those of the dielectric layer 114.

In some embodiments, conductive features including conductive vias 136 and conductive lines 138 are electrically connected to the resistive element 132, as shown in FIG. 1. In some embodiments, a dielectric layer 134 is formed on the resistive element 132. The conductive vias 136 and the conductive lines 138 are formed in the dielectric layer 134. In some embodiments, the resistive element 132 is electrically connected to other device elements through the conductive vias 136 and the conductive line 138. In some embodiments, the resistive element 132 has a greater sheet resistance than that of the conductive vias 136 or the conductive lines 138.

Due to the joule heating effect (also known as ohmic heating and resistive heating effect), the resistive element 132 produces heat during the passage of an electric current through the resistive element 132. The heat generated by the resistive element 132 may raise the temperature of nearby conductive features. In some embodiments, one or more thermal conductive elements are formed near the resistive element 132. Therefore, heat dissipation may be improved to prevent heat from being accumulated near the resistive element 132. The nearby conductive features are thus prevented from experiencing the electromigration issue which might be enhanced by high temperature.

As shown in FIG. 1, a thermal conductive element 128 is formed over the interconnect structure 116 to assist in the heat dissipation of the resistive element 132, in accordance with some embodiments. Due to the thermal conductive element 128, the heat generated by the resistive element 132 may be led out more easily and/or efficiently. In some embodiments, the thermal conductive element 128 is the first metal layer below or above the resistive element 132. In some embodiments, there is no metal layer formed between the thermal conductive element 128 and the resistive element 132.

In some embodiments, the thermal conductive element 128 is made of or includes copper, aluminum, gold, platinum, nickel, cobalt, titanium, one or more other suitable materials, or a combination thereof. In some embodiments, the thermal conductive element 128 is formed using an electroplating process, a CVD process, a PVD process, an ALD process, one or more other applicable processes, or a combination thereof.

In some embodiments, the thermal conductive element 128 is formed on a dielectric layer 126. The material and formation method of the dielectric layer 126 may be similar to or the same as those of the dielectric layer 114. In some embodiments, the dielectric layer 126 is partially removed to form an opening used for containing the thermal conductive element 128. Afterwards, a thermal conductive material is deposited over the dielectric layer 126 to fill the opening. A planarization process (such as a CMP process) is then used to remove the excess portion of the thermal conductive material outside of the opening. As a result, the thermal conductive material remaining in the opening forms the thermal conductive element 128.

In some embodiments, during the formation of the opening used for containing the thermal conductive element 128, other feature openings (not shown in FIG. 1) are also simultaneously formed in the dielectric layer 126. These feature openings may be used to contain other conductive lines (not shown in FIG. 1). In some embodiments, these conductive lines and the thermal conductive element 128 are simultaneously formed. In some embodiments, the thermal conductive material is a metal material. After the planarization process, the metal material remaining in the feature openings form the conductive lines while the metal material remaining in the opening form the thermal conductive element 128.

In some embodiments, the thermal conductive element 128 is electrically isolated from the conductive lines in the feature openings. In some embodiments, the dielectric layer 130 is between the resistive element 132 and the thermal conductive element 128. The dielectric layer 130 separates the thermal conductive element 128 from the resistive element 132. In some embodiments, the thermal conductive element 128 is electrically isolated from the resistive element 132. In some embodiments, the thermal conductive element 128 is electrically isolated from the gate stacks 104 or the source/drain structures 112 nearby. In some embodiments, the thermal conductive element 128 is electrically isolated from any transistor.

Figure 2A:
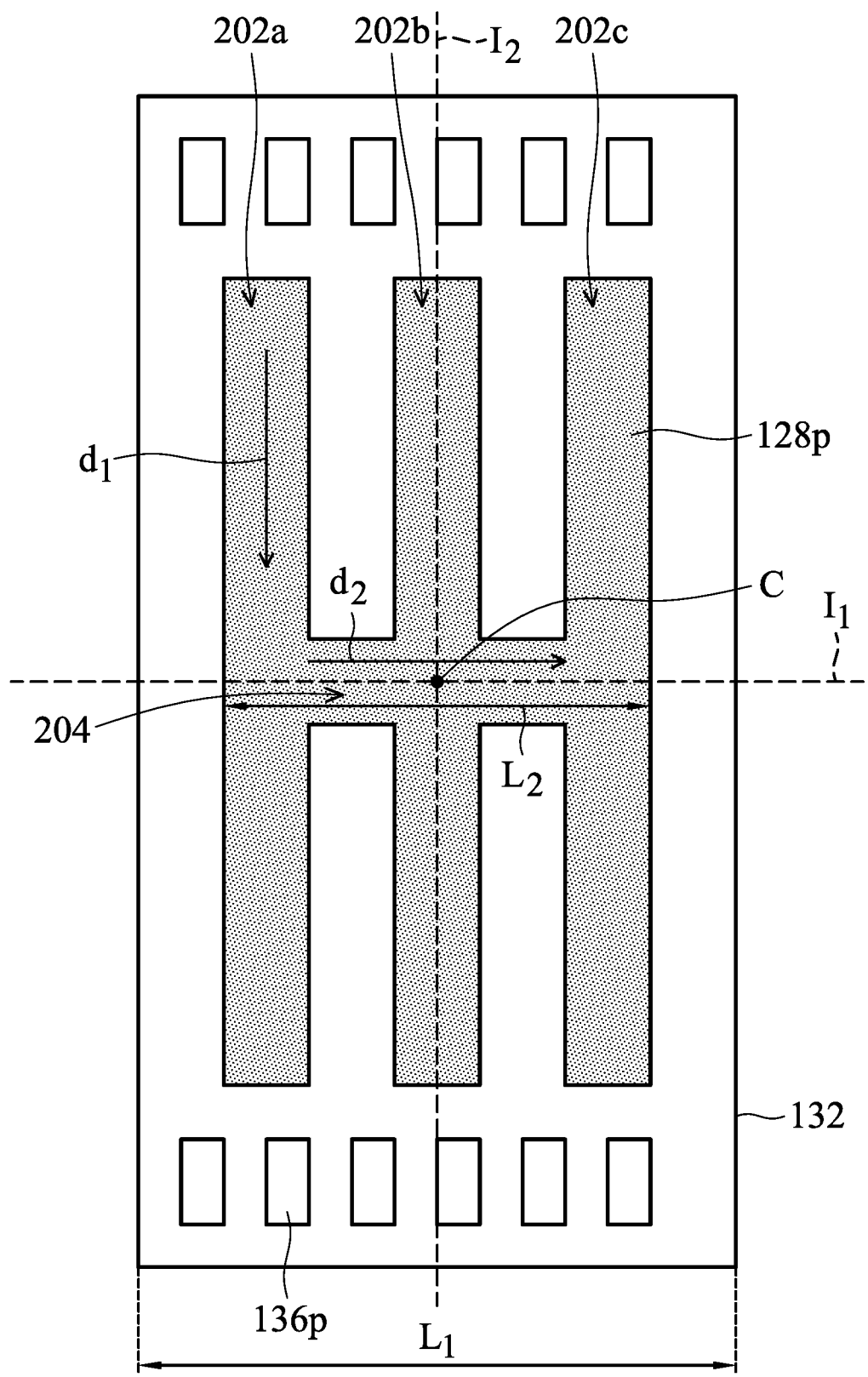
FIG. 2A is a top view showing a main surface of a resistive element on which a direct projection of a thermal conductive element is illustrated, in accordance with some embodiments.

The thermal conductive element 128 may have a variety of different patterns. FIG. 2A shows relationship between the resistive element 132 and thermal conductive element 128 of the semiconductor device structure, in accordance with some embodiments. In some embodiments, FIG. 2A is a top view of a main surface (such as the top surface or the bottom surface) of the resistive element 132. A direct projection 128$p$ of the thermal conductive element 128 on the main surface of the resistive element 132 is also shown in FIG. 2A. Therefore, the relationship between the resistive element 132 and thermal conductive element 128 may be observed. In some embodiments, a direct projection 136$p$ of the conductive vias 136 is also shown in FIG. 2A.

As shown in FIG. 2A, the direct projection 128$p$ of the thermal conductive element 128 covers a center C of the main surface of the resistive element 132, in accordance with some embodiments. In some embodiments, the center portion of the resistive element 132 produces more heat and has a higher temperature than other portions of the resistive element 132. Because the thermal conductive element 128 covers the center C of the resistive element 132, the heat coming from the center portion of the resistive element 132 may be led out more easily and/or efficiently. Therefore, the heat dissipation of the resistive element 132 may be improved since the thermal conductive element 128 is nearby. The nearby conductive features are thus prevented from experiencing the electromigration issue caused by high temperature.

In some embodiments, the main surface of the resistive element 132 has a first imaginary line $I_1$ and a second imaginary line $I_2$, as shown in FIG. 2A. The first imaginary line $I_1$ and the second imaginary line $I_2$ are perpendicular to each other and intersect at a center C of the main surface of the resistive element 132. In some embodiments, the first imaginary line $I_1$ and the second imaginary line $I_2$ are two middle lines of the main surface of the resistive element 132. In some embodiments, the direct projection 128$p$ of the thermal conductive element 128 extends across a portion of the first imaginary line $I_1$ and a portion of the second imaginary line $I_2$, as shown in FIG. 2A. The thermal conductive element 128 is large such that the direct projection 128$p$ extends across both the first imaginary line $I_1$ and the second imaginary line $I_2$. Because the thermal conductive element 128 occupies a large area, heat generated by the resistive element 132 may be led out more easily and/or efficiently. The heat dissipation of the resistive element 132 is improved.

As shown in FIG. 2A, the resistive element 132 has a length $L_1$, and the direct projection 128$p$ of the thermal conductive element 128 has a length $L_2$. In some embodiments, the length $L_2$ is greater than a quarter of the length $L_1$. In some other embodiments, the length $L_2$ is greater than a half of the length $L_1$. Because the thermal conductive element 128 has a long length, the heat coming from the resistive element 132 may be led out more easily and/or efficiently.

In some embodiments, the thermal conductive element 128 includes multiple first portions that correspond to the portions 202$a$, 202$b$, and 202$c$ of the direct projection 128$p$, as shown in FIG. 2A. In some embodiments, each of the first portions (corresponding to the portions 202$a$-202$c$) extends along a first direction $d_1$, as shown in FIG. 2A. In some embodiments, the thermal conductive element 128 also includes a second portion that corresponds to the portion 204 of the direct projection 128$p$. The second portion (corresponding to the portion 204) extends along a second direction $d_2$ that is not parallel to the first direction $d_1$. In some embodiments, the second portion (corresponding to the portion 204) intersects one or more of the first portions (corresponding to the portions 202$a$, 202$b$, and/or 202$c$). The heat coming from the center of the resistive element 132 may be led out through the second portion (204) to the first portions (202$a$-202$c$) more easily and/or efficiently.

Many variations and/or modifications can be made to embodiments of the disclosure. FIGS. 2B-2F are top views of the semiconductor device structure, in accordance with some embodiments. Each of FIGS. 2B-2F shows the relationship between the resistive element 132 and thermal conductive element 128 of the semiconductor device structure, in accordance with some embodiments. In some embodiments, each of FIGS. 2B-2F is a top view of a main surface (such as the top surface or the bottom surface) of the resistive element 132. The direct projection 128p of the thermal conductive element 128 on the main surface of the resistive element 132 is also shown in FIGS. 2B-2F. Therefore, the relationship between the resistive element 132 and thermal conductive element 128 may be observed. In some embodiments, the direct projection 136p of the conductive vias 136 is also shown in FIGS. 2B-2F.

Figure 2B:
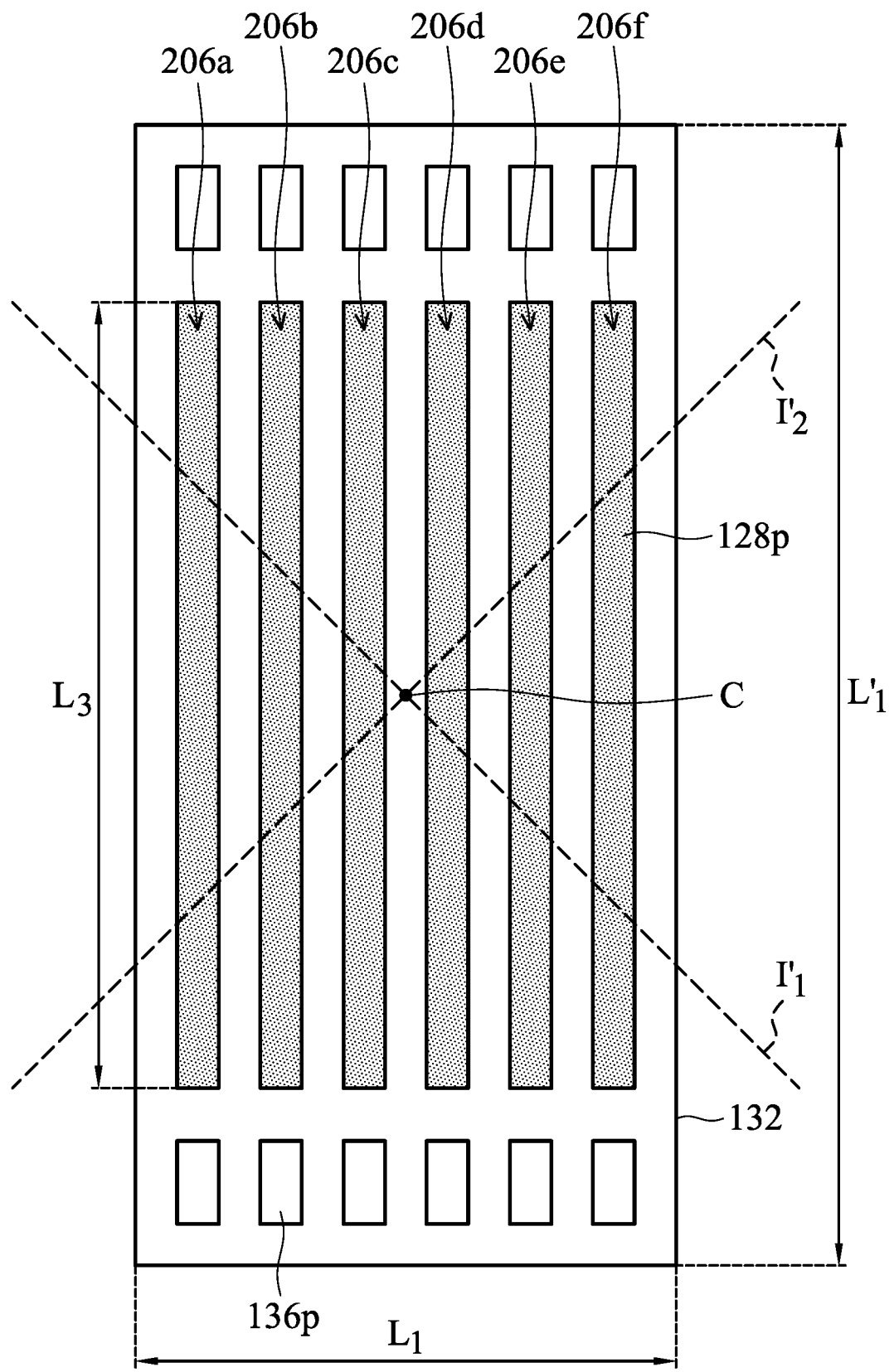
FIG. 2B is a top view showing a main surface of a resistive element on which a direct projection of a thermal conductive element is illustrated, in accordance with some embodiments.

As shown in FIG. 2B, the main surface of the resistive element 132 has two imaginary lines $I_1'$ and $I_2'$ that are perpendicular to each other and intersect at the center C of the main surface of the resistive element 132. In some embodiments, the direct projection 128p of the thermal conductive element 128 on the main surface of the resistive element 132 extends across the imaginary lines $I_1'$ and $I_2'$, as shown in FIG. 2B.

In some embodiments, the direct projection 128p of the thermal conductive element 128 does not cover the center C of the main surface of the resistive element 132, as shown in FIG. 2B. In some embodiments, the direct projection 128p of the thermal conductive element 128 has a length $L_3$ that is greater than a quarter of the length $L_1$ of the resistive element 132, as shown in FIG. 2B. In some embodiments, the length $L_3$ is also greater than a quarter of a length $L_1'$ of the resistive element 132, as shown in FIG. 2B.

In some embodiments, the thermal conductive element 128 has multiple portions that correspond to the portions 206a-206f of the direct projection 128p on the main surface of the resistive element 132, as shown in FIG. 2B. In some embodiments, each of the portions (corresponding to the portions 206a-206f) is separated from each other. In some embodiments, each of the portions (corresponding to the portions 206a-206f) extends along a same direction.

Many variations and/or modifications can be made to embodiments of the disclosure. In some embodiments, the thermal conductive element 128 has a net-like pattern or a mesh-like pattern.

Figure 2C:
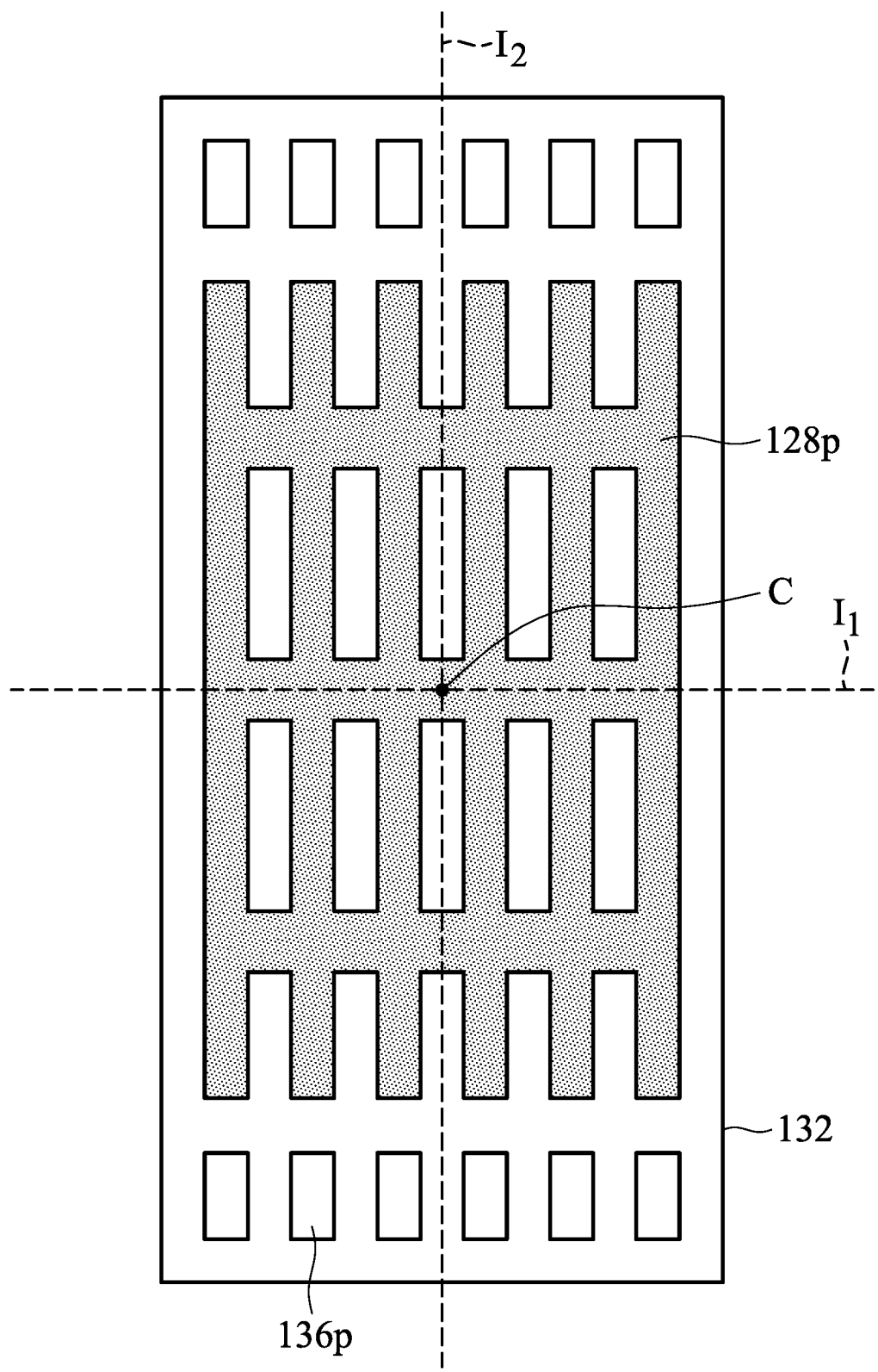
FIG. 2C is a top view showing a main surface of a resistive element on which a direct projection of a thermal conductive element is illustrated, in accordance with some embodiments.
Figure 2D:
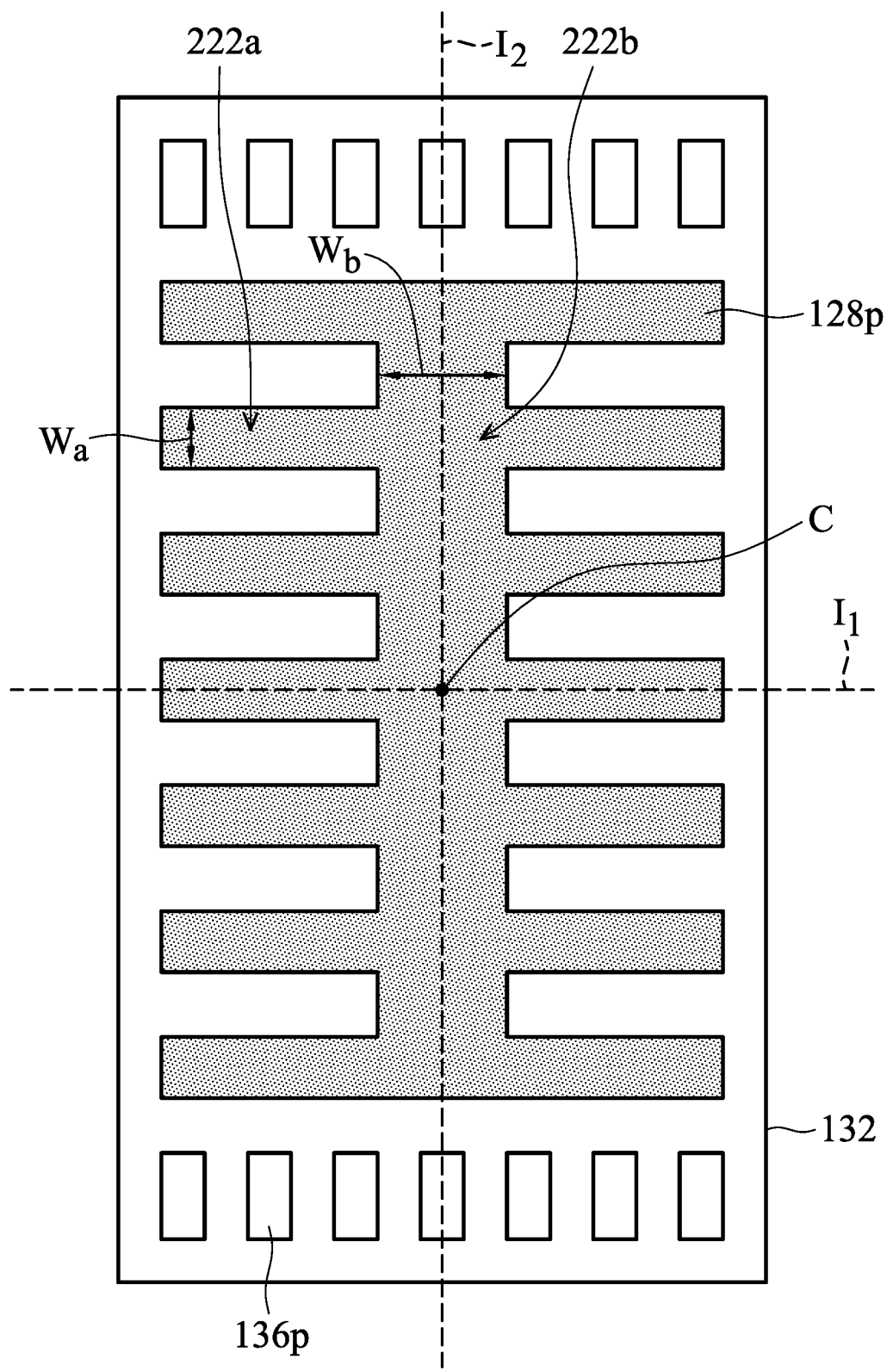
FIG. 2D is a top view showing a main surface of a resistive element on which a direct projection of a thermal conductive element is illustrated, in accordance with some embodiments.
Figure 2E:
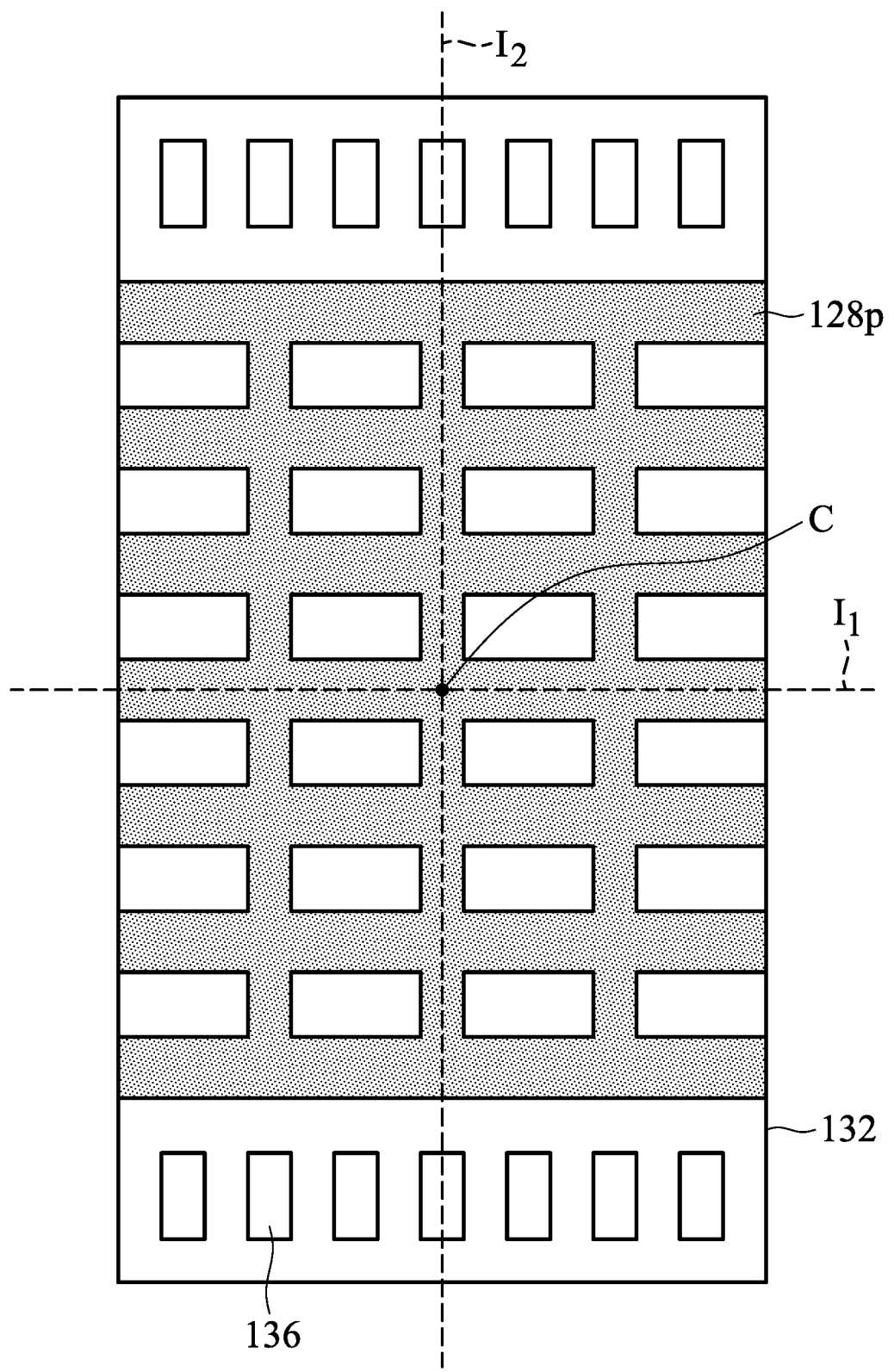
FIG. 2E is a top view showing a main surface of a resistive element on which a direct projection of a thermal conductive element is illustrated, in accordance with some embodiments.

In some embodiments such as that shown in FIG. 2C or FIG. 2E, the direct projection 128p of the thermal conductive element 128 on the main surface of the resistive element 132 has a net-like or a mesh-like profile. In some embodiments, the thermal conductive element 128 is a metal mesh or a metal net. The heat generated by the resistive element 132 may be led out by the metal mesh more easily and/or efficiently.

Many variations and/or modifications can be made to embodiments of the disclosure. In some embodiments, the thermal conductive element 128 has multiple portions that have different widths.

In some embodiments, the thermal conductive element 128 has multiple portions including the portions that correspond to portions 222a and 222b of the direct projection 128p on the main surface of the resistive element 132, as shown in FIG. 2D. As shown in FIG. 2D, the portion (corresponding to the portion 222a) has a width $W_a$, and the portion (corresponding to the portion 222b) has a width $W_b$. In some embodiments, the widths $W_a$ and $W_b$ are different from each other. For example, the width $W_b$ is greater than the width $W_a$.

Figure 2F:
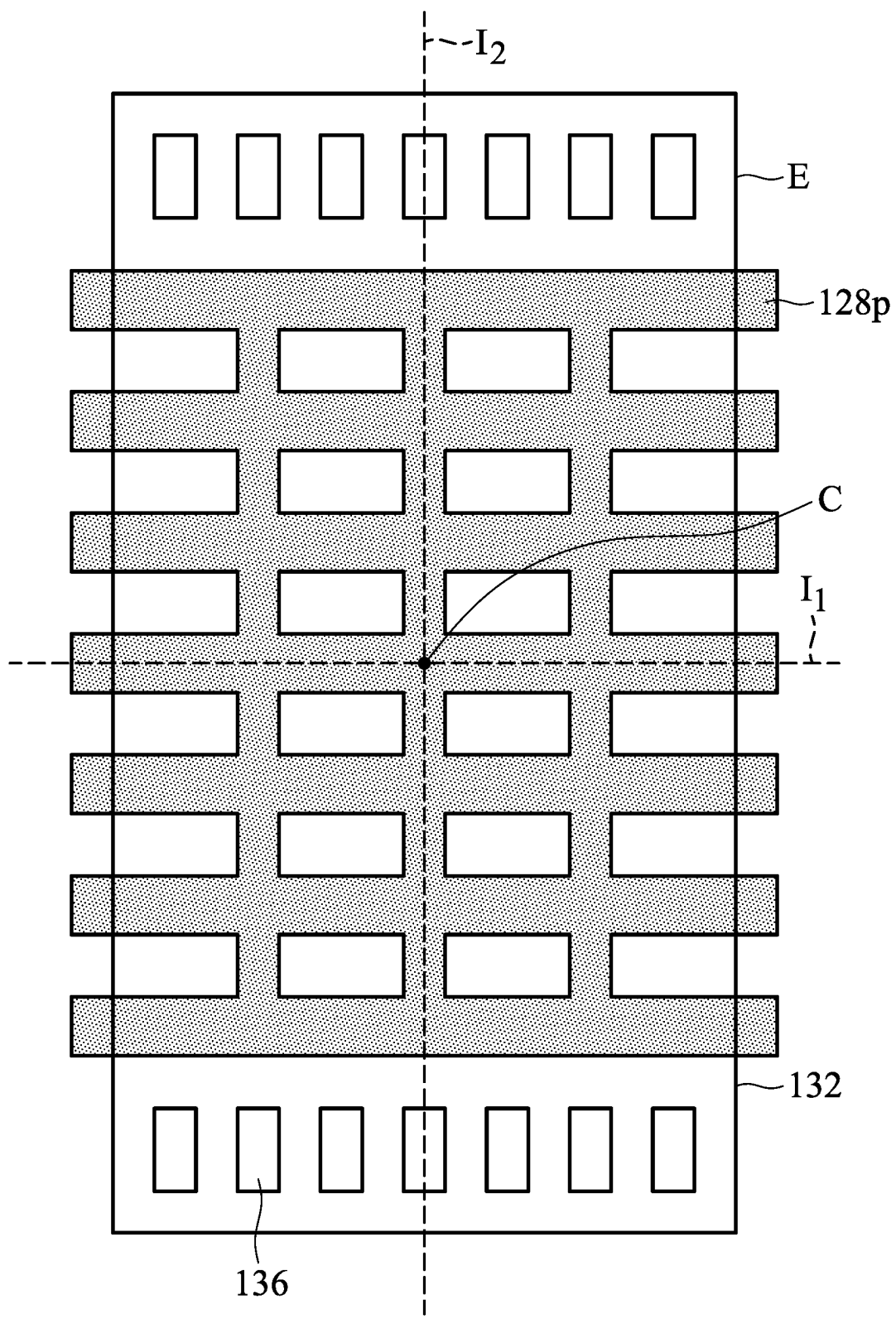
FIG. 2F is a top view showing a main surface of a resistive element on which a direct projection of a thermal conductive element is illustrated, in accordance with some embodiments.

Many variations and/or modifications can be made to embodiments of the disclosure. In some embodiments, the thermal conductive element 128 extends across a portion of an edge E of the resistive element 132. As shown in FIG. 2F, in some embodiments, the direct projection 128p of the thermal conductive element 128 exceeds the edge E of the resistive element 132.

Many variations and/or modifications can be made to embodiments of the disclosure. In some embodiments, there are two or more thermal conductive elements used in the semiconductor device structure to lead out the heat generated by the resistive element 132.

As shown in FIG. 1, a dielectric layer 122 and a second thermal conductive element 124 are formed before the formation of the thermal conductive element 128, in accordance with some embodiments. The second thermal conductive element 124 may assist in the heat dissipation of the resistive element 132. In some embodiments, the material and formation method of the second thermal conductive element 124 are the same as or similar to those of the thermal conductive element 128. In some embodiments, the second thermal conductive element 124 is separated from the thermal conductive element 128 by the dielectric layer 126.

In some embodiments, a direct projection of the second thermal conductive element 124 on the main surface of the resistive element 132 extends across the first imaginary line $I_1$ and the second imaginary line $I_2$ of the main surface of the resistive element 132. In some embodiments, the second thermal conductive element 124 has a pattern or profile that is the same as or similar to that of the thermal conductive element 128. For example, the direct projection of the second thermal conductive element 124 on the main surface of the resistive element 132 may be the same as one of those shown in FIGS. 2A-2F. In some embodiments, the direct projection of the second thermal conductive element 124 and the direct projection 128p of thermal conductive element 128 on the main surface of the resistive element 132 substantially overlap each other.

In some embodiments, a thermal conductive element 140 is formed over the resistive element 132 to assist in the heat dissipation of the resistive element 132, as shown in FIG. 1. In some embodiments, the material and formation method of the thermal conductive element 140 are the same as or similar to those of the thermal conductive element 128. In some embodiments, the thermal conductive element 140 and the conductive lines 138 are simultaneously formed. In some embodiments, the thermal conductive element 140 is electrically isolated from the conductive lines 138 or the resistive element 132. In some embodiments, the dielectric layer 134 separates the thermal conductive element 140 from the resistive element 132. In some embodiments, there is no metal layer formed between the thermal conductive element 140 and the resistive element 132.

In some embodiments, a direct projection of the thermal conductive element 140 on the main surface of the resistive element 132 extends across the first imaginary line $I_1$ and the second imaginary line $I_2$ of the main surface of the resistive element 132. In some embodiments, the thermal conductive element 140 has a pattern or profile that is the same as or similar to that of the thermal conductive element 128. For example, the direct projection of the thermal conductive element 140 on the main surface of the resistive element 132 may be the same as or similar to one of those shown in FIGS. 2A-2F. In some embodiments, the direct projection of the thermal conductive element 140 and the direct projection 128p of thermal conductive element 128 on the main surface of the resistive element 132 substantially overlap each other.

As shown in FIG. 1, a dielectric layer 142 and another thermal conductive element 144 are formed on the thermal conductive element 140, in accordance with some embodiments. In some embodiments, the material and formation method of the second thermal conductive element 144 are the same as or similar to those of the thermal conductive element 140. In some embodiments, the thermal conductive element 144 has a pattern or profile that is the same as or similar to that of the thermal conductive element 140.

As shown in FIG. 1, an interconnect structure 146 is formed over the resistive element 132, in accordance with some embodiments. The interconnect structure 146 may include a dielectric material 148 and conductive lines 150. The material and formation method of the interconnect structure 146 may be the same as or similar to those of the interconnect structure 116.

Figure 3:
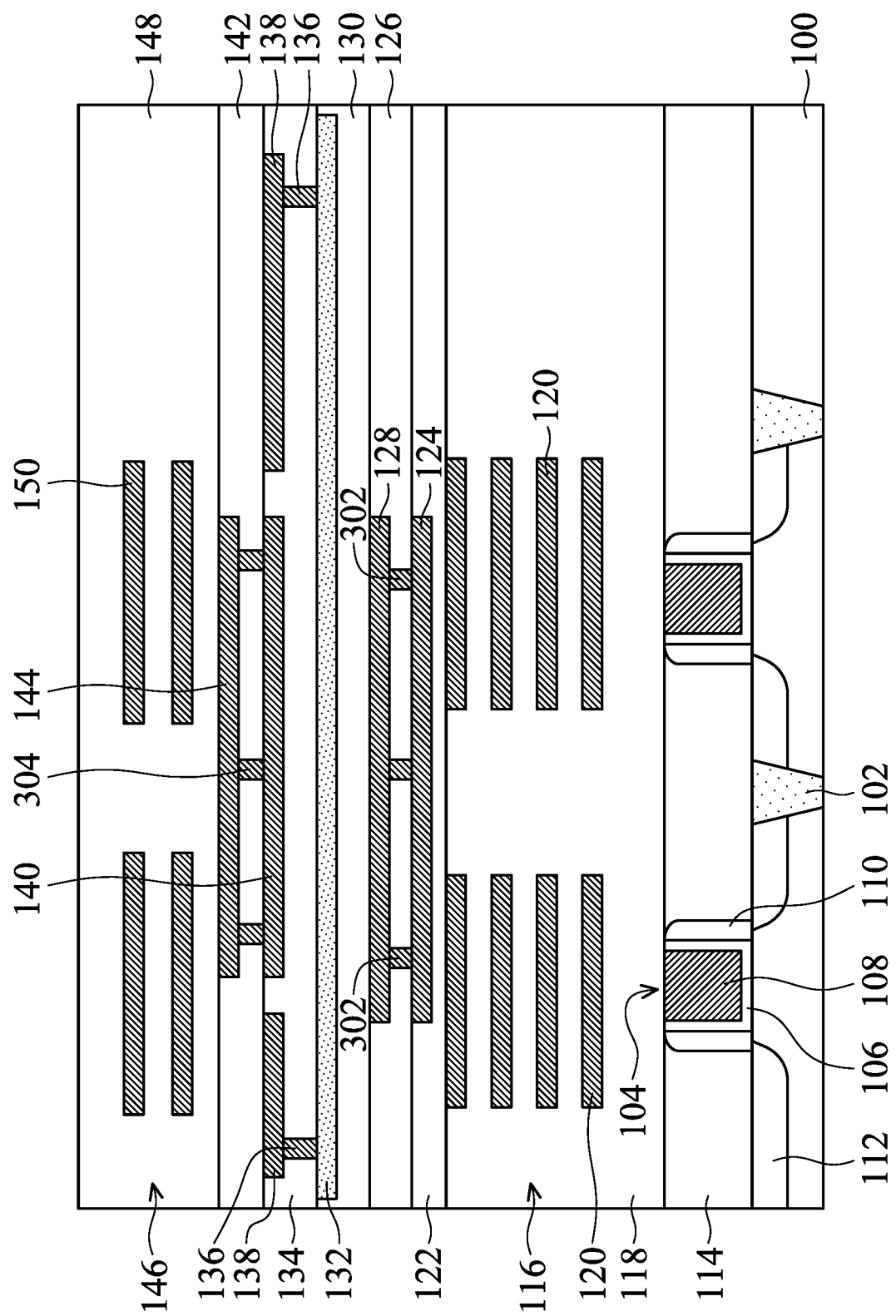
FIG. 3 is a cross-sectional view of a semiconductor device structure, in accordance with some embodiments.

Many variations and/or modifications can be made to embodiments of the disclosure. FIG. 3 is a cross-sectional view of a semiconductor device structure, in accordance with some embodiments.

As shown in FIG. 3, a structure similar to that shown in FIG. 1 is provided or received, in accordance with some embodiments. In some embodiments, one or more thermal conductive vias 302 are formed between the thermal conductive element 128 and the second thermal conductive element 124. In some embodiments, the thermal conductive vias 302 are in direct contact with the thermal conductive element 128 and the second thermal conductive element 124. Due to the connection of the thermal conductive vias, the heat coming from the resistive element 132 may be led out more easily and/or efficiently.

As shown in FIG. 3, one or more thermal conductive vias 304 are formed between the thermal conductive elements 140 and 144. In some embodiments, the thermal conductive vias 304 are in direct contact with the thermal conductive elements 140 and 144. Due to the connection of the thermal conductive vias, the heat coming from the resistive element 132 may be led out more easily and/or efficiently.

Figure 4:
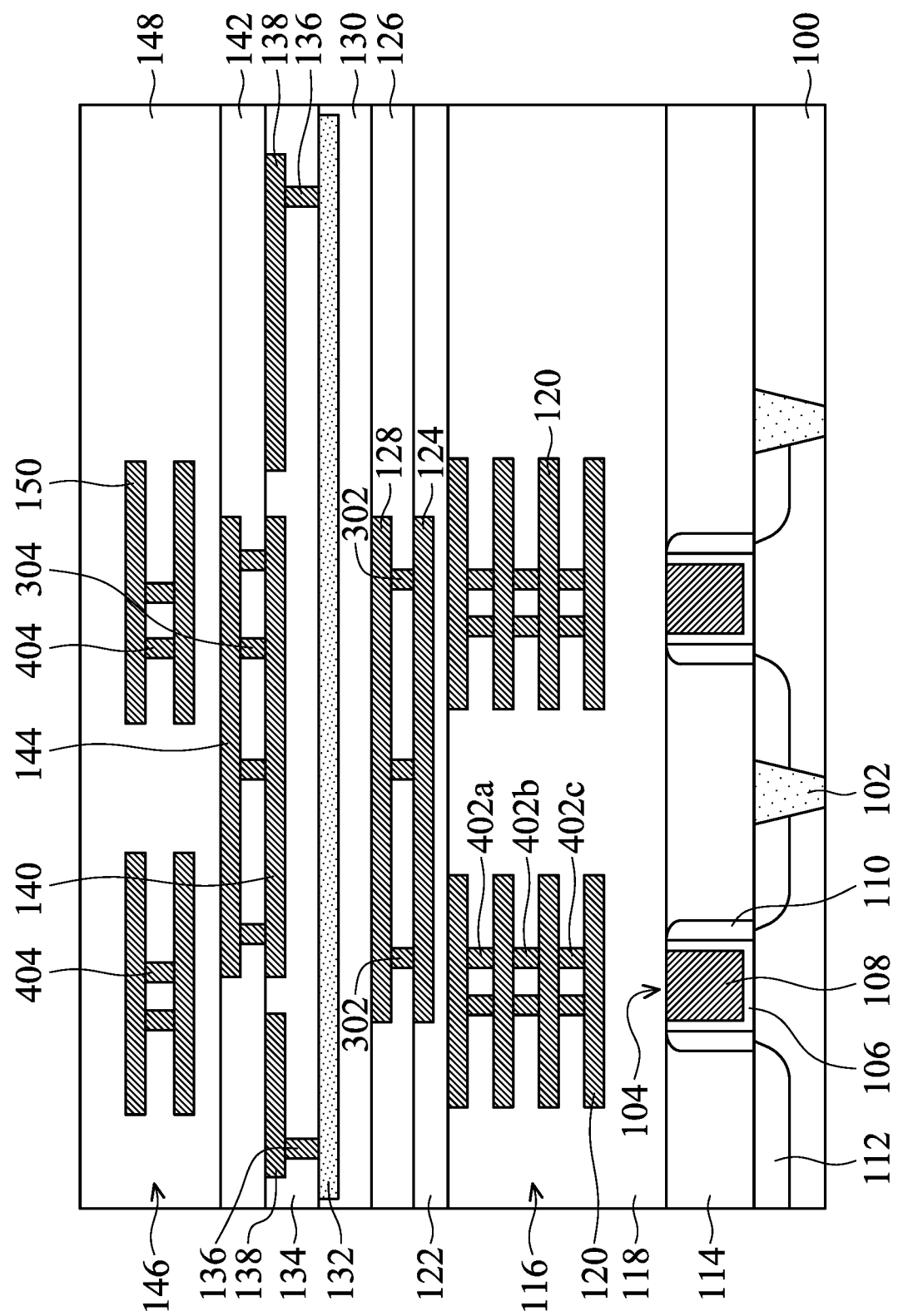
FIG. 4 is a cross-sectional view of a semiconductor device structure, in accordance with some embodiments.

Many variations and/or modifications can be made to embodiments of the disclosure. FIG. 4 is a cross-sectional view of a semiconductor device structure, in accordance with some embodiments.

As shown in FIG. 4, a structure similar to that shown in FIG. 3 is provided or received, in accordance with some embodiments. In some embodiments, the positions of conductive vias between the conductive lines 120 are arranged to improve the heat dissipation of the resistive element 132. In some embodiments, the interconnect structure 116 includes multiple conductive vias including conductive vias 402a, 402b, and 402c, as shown in FIG. 4. In some embodiments, the conductive vias 402a is between one of the thermal conductive vias 302 and the conductive vias 402b (or 402c). In some embodiments, the conductive via 402a is substantially aligned with the conductive via 402b (or 402c) and the corresponding thermal conductive via 302. The heat coming from the resistive element 132 may be led out more easily and/or efficiently since the conductive vias 402a, 402b, 402c and the conductive lines 120 connected to these conductive vias may also be used improve the heat dissipation of the resistive element 132.

In some embodiments, the interconnect structure 146 also includes multiple conductive vias including conductive vias 404. In some embodiments, one of the conductive vias 404 is substantially aligned with one of the thermal conductive vias 304 or 302. Therefore, the heat dissipation of the resistive element 132 may be improved.

Figure 5:
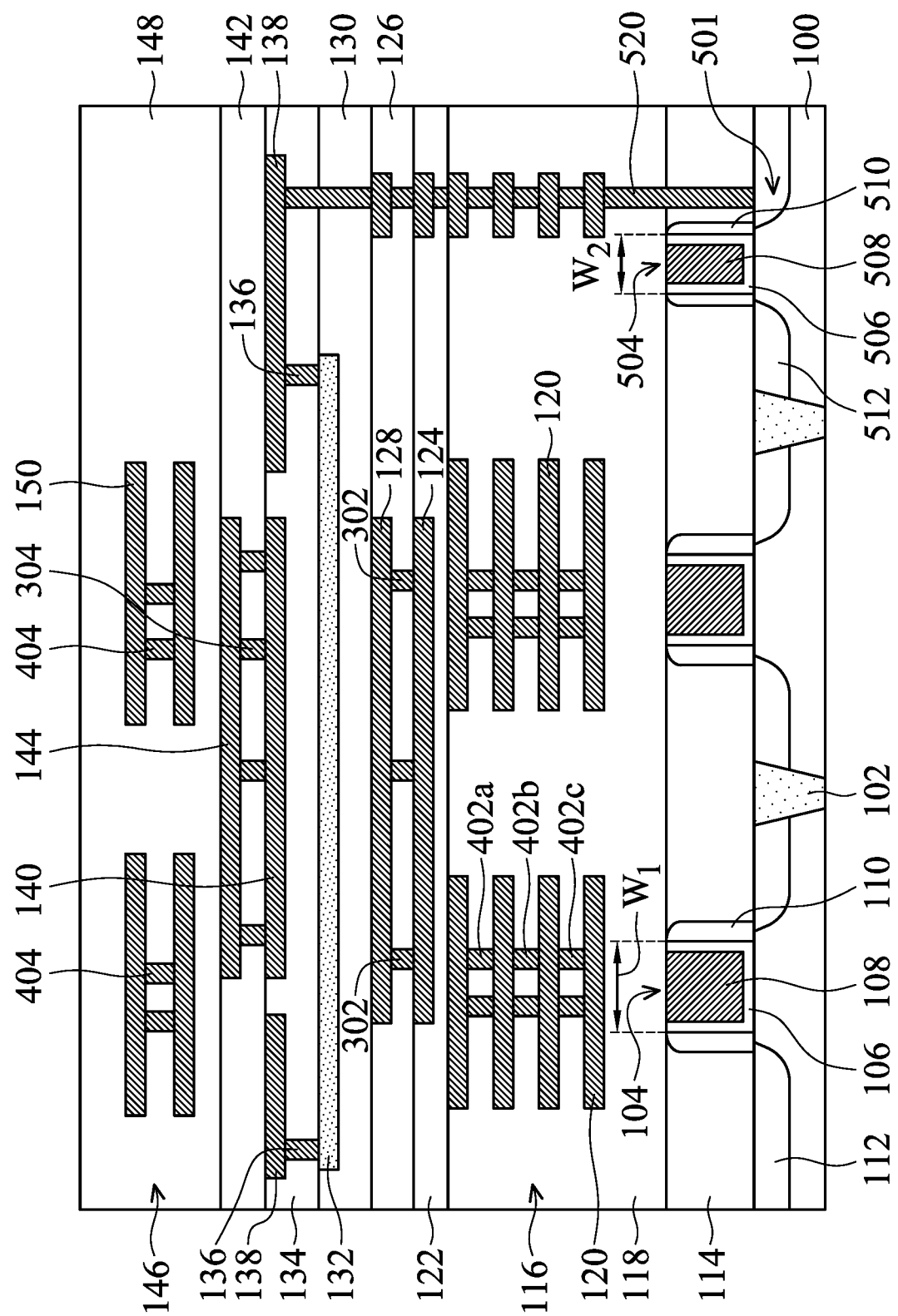
FIG. 5 is a cross-sectional view of a semiconductor device structure, in accordance with some embodiments.

Many variations and/or modifications can be made to embodiments of the disclosure. FIG. 5 is a cross-sectional view of a semiconductor device structure, in accordance with some embodiments.

As shown in FIG. 5, a structure similar to that shown in FIG. 4 is provided or received, in accordance with some embodiments. In some embodiments, the resistive element 132 is electrically connected to a transistor 501. The transistor 501 includes a gate stack 504 that has a gate dielectric layer 506 and a gate electrode 508. Spacer elements 510 are formed over sidewalls of the gate stack 504. Source/drain structures 512 are formed in the semiconductor substrate 100. In some embodiments, the resistive element 132 is electrically connected to one of the source/drain structures 512 through the conductive via 136, the conductive line 138, and a conductive structure 520, as shown in FIG. 5. In some embodiments, the conductive structure 520 includes multiple conductive lines, conductive vias, and a conductive contact.

As shown in FIG. 5, the gate stack 104 that is directly under the resistive element 132 has a gate length $W_1$. In some embodiments, the gate stack 504 is not directly under the resistive element 132, as shown in FIG. 5. The gate stack 504 has a gate length $W_2$. In some embodiments, the gate length $W_1$ is greater than the gate length $W_2$. In some embodiments, the gate stack 104 produces less heat than the gate stack 504. Therefore, the temperature near the gate stack 104 may be lower, which facilitates to the heat dissipation of the resistive element 132.

Figure 6:
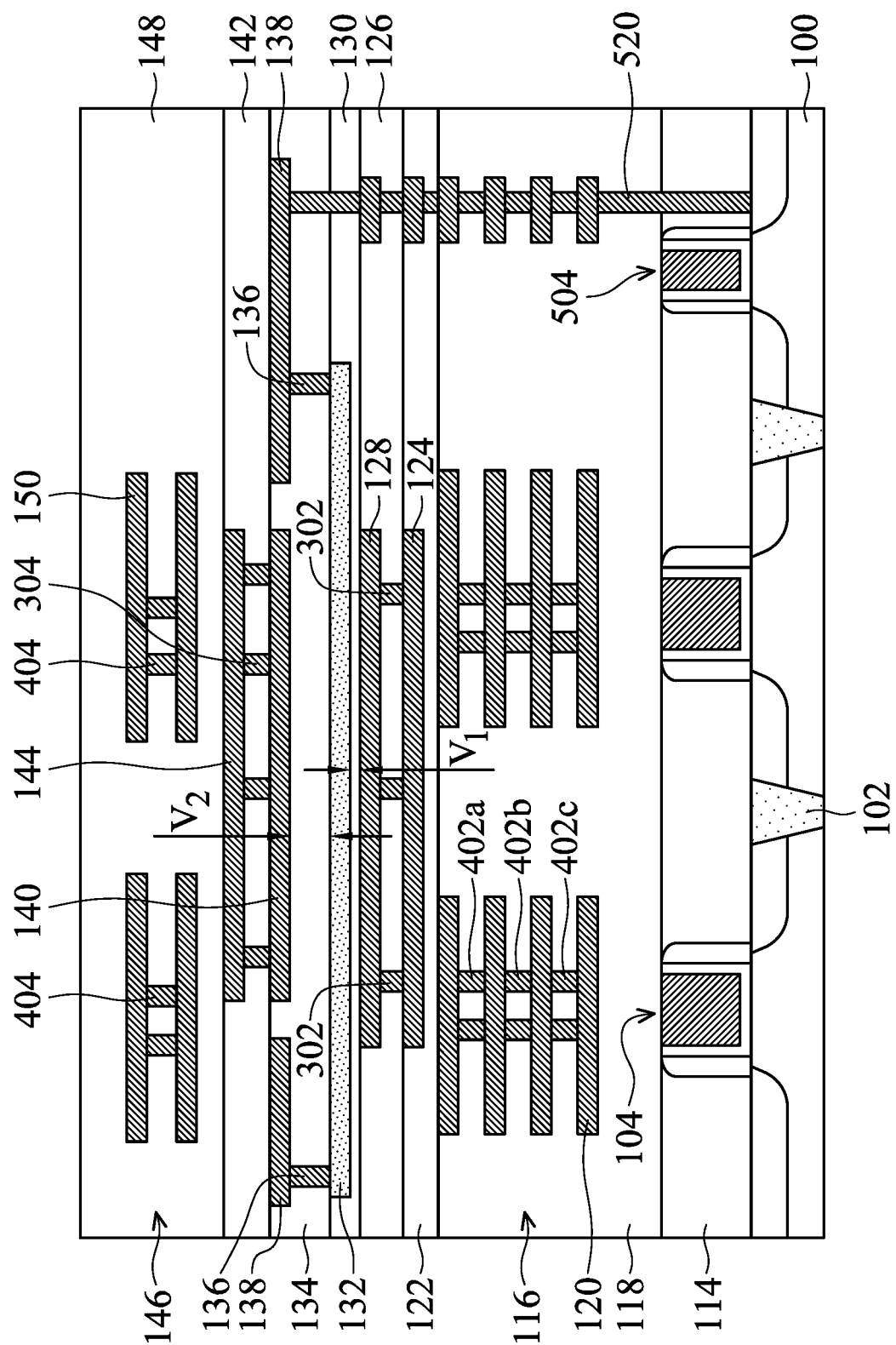
FIG. 6 is a cross-sectional view of a semiconductor device structure, in accordance with some embodiments.

Many variations and/or modifications can be made to embodiments of the disclosure. FIG. 6 is a cross-sectional view of a semiconductor device structure, in accordance with some embodiments.

As shown in FIG. 6, a structure similar to that shown in FIG. 5 is provided or received, in accordance with some embodiments. As shown in FIG. 6, a vertical distance $V_1$ is between the resistive element 132 and the thermal conductive element 128. A vertical distance $V_2$ is between the resistive element 132 and the thermal conductive element 140. In some embodiments, the vertical distances $V_1$ and $V_2$ are different from each other. In some embodiments, the vertical distances $V_1$ is smaller than the vertical distances $V_2$. The heat generated by the resistive element 132 may be led out through the thermal conductive element 128 more easily and/or efficiently.

Figure 7:
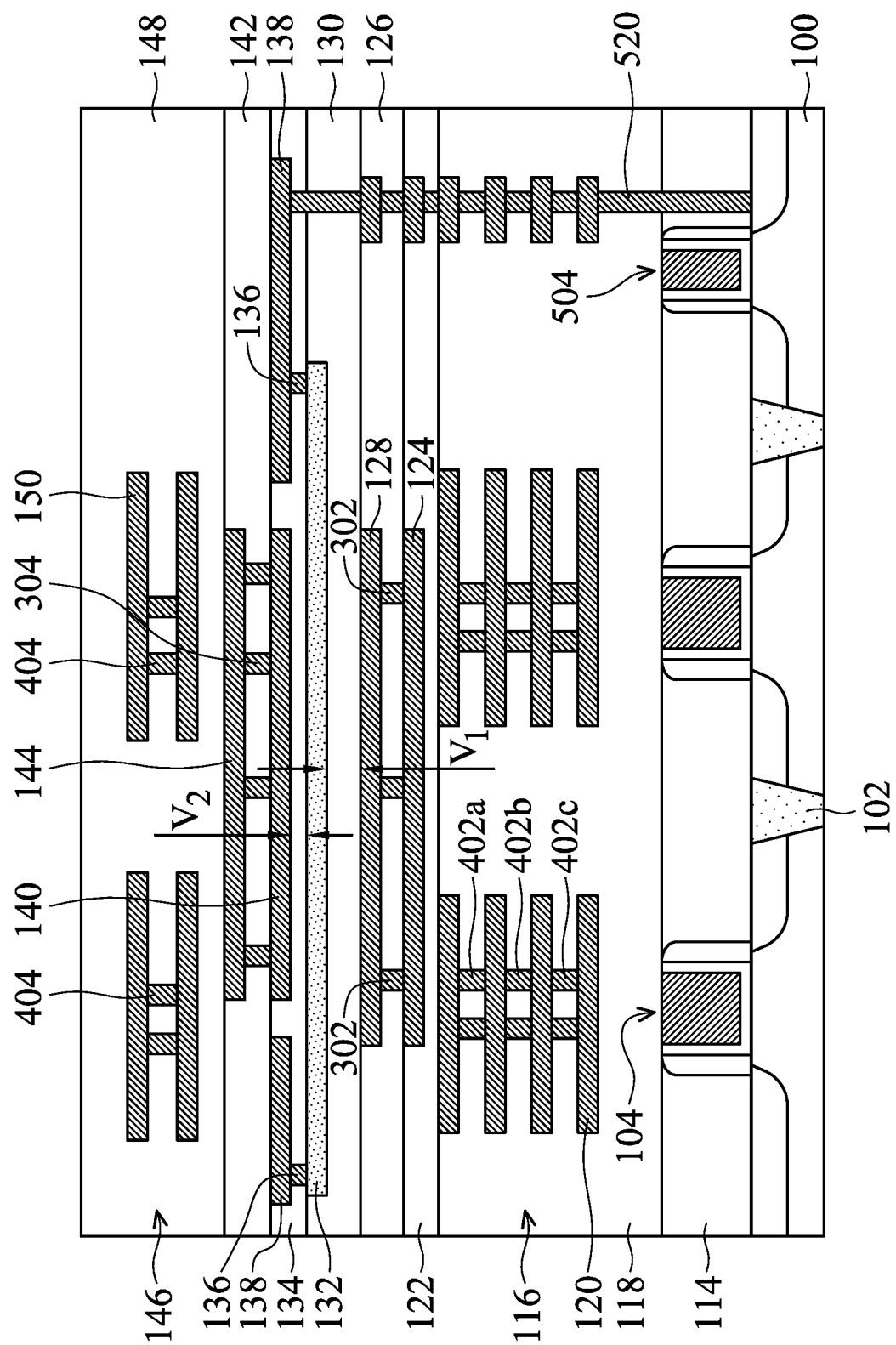
FIG. 7 is a cross-sectional view of a semiconductor device structure, in accordance with some embodiments.

Many variations and/or modifications can be made to embodiments of the disclosure. FIG. 7 is a cross-sectional view of a semiconductor device structure, in accordance with some embodiments.

As shown in FIG. 7, a structure similar to that shown in FIG. 5 is provided or received, in accordance with some embodiments. In some embodiments, the vertical distances $V_1$ and $V_2$ are different from each other, as shown in FIG. 7. In some embodiments, the vertical distances $V_2$ is smaller than the vertical distances $V_1$. The heat generated by the resistive element 132 may be led out through the thermal conductive element 140 more easily and/or efficiently.

Figure 8:
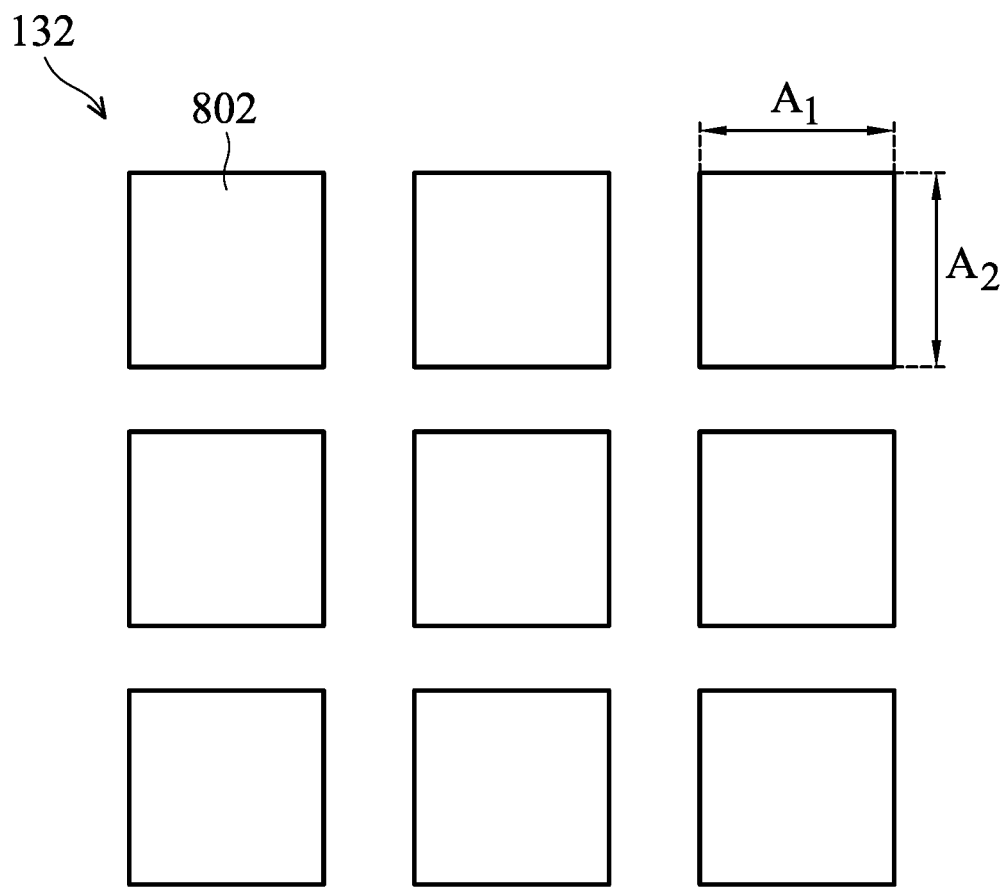
FIG. 8 is a top view of a resistive element in a semiconductor device structure, in accordance with some embodiments.

Many variations and/or modifications can be made to embodiments of the disclosure. FIG. 8 is a top view of a resistive element in a semiconductor device structure, in accordance with some embodiments.

In some embodiments, the resistive element 132 mentioned above is divided into an array of multiple resistive structures 802. In some embodiments, each of the resistive structure 802 has a width $A_1$ and a width $A_2$. In some embodiments, the width $A_1$ is smaller than about 1 μm, and the width $A_2$ is smaller than about 2 μm. These resistive structures 802 are electrically connected to each other. For example, conductive lines, conductive vias, and/or the like may be used to electrically connect these resistive structures 802. The resistive element 132 is divided into multiple smaller portions (the resistive structures 802). The heat generated by the resistive element 132 is redistributed over a larger area other than concentrated at a center of a larger resistive element. The heat dissipation of the resistive element 132 may be improved.

Figure 9:
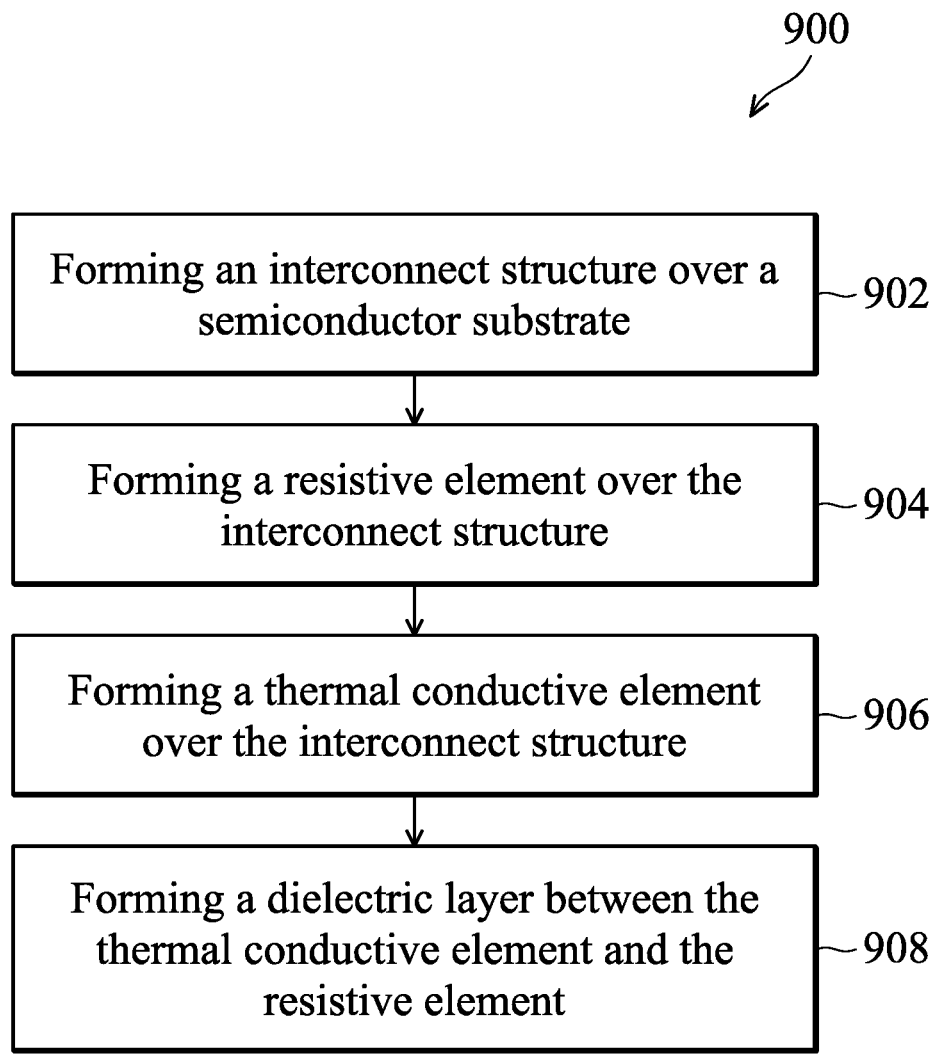
FIG. 9 is a flow chart illustrating a method for forming a semiconductor device structure, in accordance with some embodiments.

FIG. 9 is a flow chart illustrating a method 900 for forming a semiconductor device structure, in accordance with some embodiments. The method 900 includes an operation 902 in which an interconnect structure (such as the interconnect structure 116) is formed over a semiconductor substrate (such as the semiconductor substrate 100). The method 900 also include an operation 904 in which a resistive element (such as the resistive element 132) is formed over the interconnect structure. The method 900 further includes an operation 906 in which a thermal conductive element (such as the thermal conductive element 128 or 140) is formed over the interconnect structure. In some embodiments, the operation 904 is performed before the operation 906. In some other embodiments, the operation 904 is performed after the operation 906. The method 900 includes an operation 908 in which a dielectric layer (such as the dielectric layer 130 or 134) is formed between the thermal conductive element and the resistive element.

Embodiments of the disclosure form a semiconductor device structure with a resistive element. One or more thermal conductive elements are formed directly above or directly under the resistive element. Therefore, heat generated by the resistive element may be led out more easily and/or efficiently by the thermal conductive elements. The temperature near the resistive element may therefore be reduced. The elements near the resistive element may be prevented from being negatively affected since the heat has been led out. For example, conductive features near the resistive element are prevented from occurring electromigration effect. The reliability and performance of the semiconductor device structure are significantly improved.

In accordance with some embodiments, a semiconductor device structure is provided. The semiconductor device structure includes a semiconductor substrate and a gate stack over the semiconductor substrate. The semiconductor device structure also includes an interconnect structure over the gate stack and the semiconductor substrate. The semiconductor device structure further includes a resistive element over the interconnect structure, and the resistive element is positioned directly above the gate stack. In addition, the semiconductor device structure includes a thermal conductive element over the interconnect structure. A direct projection of the thermal conductive element on a main surface of the resistive element extends across a portion of a first imaginary line and a portion of a second imaginary line of the main surface. The first imaginary line is perpendicular to the second imaginary line. The first imaginary line and the second imaginary line intersect at a center of the main surface. The semiconductor device structure includes a dielectric layer separating the thermal conductive element from the resistive element.

In accordance with some embodiments, a semiconductor device structure is provided. The semiconductor device structure includes a semiconductor substrate and an interconnect structure over the semiconductor substrate. The semiconductor device structure also includes a resistive element over the interconnect structure and a thermal conductive element over the interconnect structure. A direct projection of the thermal conductive element on a main surface of the resistive element covers a center of the main surface. The semiconductor device structure further includes a dielectric layer between the thermal conductive element and the resistive element.

In accordance with some embodiments, a semiconductor device structure is provided. The semiconductor device structure includes a semiconductor substrate and an interconnect structure over the semiconductor substrate. The semiconductor device structure also includes a resistive element over the interconnect structure, and the resistive element has a first length. The semiconductor device structure further includes a thermal conductive element over the interconnect structure. A direct projection of the thermal conductive element on a main surface of the resistive element has a second length greater than a quarter of the first length of the resistive element. In addition, the semiconductor device structure includes a dielectric layer between the thermal conductive element and the resistive element.

In accordance with some embodiments, a method for forming a semiconductor device structure is provided. The method includes forming an interconnect structure over a semiconductor substrate and forming a resistive element over the interconnect structure. The method also includes forming a thermal conductive element over the interconnect structure. A direct projection of the thermal conductive element on a main surface of the resistive element extends across a portion of a first imaginary line and a portion of a second imaginary line of the main surface. The first imaginary line is perpendicular to the second imaginary line, and the first imaginary line and the second imaginary line intersect at a center of the main surface. The method further includes forming a dielectric layer between the thermal conductive element and the resistive element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a resistive element over the substrate; and
   a thermal conductive element over the substrate, wherein a direct projection of the thermal conductive element on a main surface of the resistive element extends across a portion of a first imaginary line and a portion of a second imaginary line of the main surface, the first imaginary line is perpendicular to the second imaginary line, and the first imaginary line and the second imaginary line intersect at a center of the main surface.

2. The semiconductor device structure as claimed in claim 1, wherein the thermal conductive element is closer to the substrate than the resistive element.

3. The semiconductor device structure as claimed in claim 1, further comprising a dielectric layer separating the thermal conductive element from the resistive element.

4. The semiconductor device structure as claimed in claim 1, wherein there is no metal layer between the thermal conductive element and the resistive element.

5. The semiconductor device structure as claimed in claim 1, wherein the thermal conductive element comprises:
- a plurality of first portions extending along a first direction; and
- at least one second portion intersecting at least some of the first portions.

6. The semiconductor device structure as claimed in claim 1, wherein the thermal conductive element comprises a plurality of portions separated from each other.

7. The semiconductor device structure as claimed in claim 1, further comprising a second thermal conductive element, wherein the thermal conductive element is between the second thermal conductive element and the resistive element.

8. The semiconductor device structure as claimed in claim 7, further comprising a thermal conductive via between the thermal conductive element and the second conductive element.

9. The semiconductor device structure as claimed in claim 8, wherein the interconnect structure comprises a first conductive via and a second conductive via, the second conductive via is between the first conductive via and the thermal conductive via, and the second conductive via is substantially aligned with the first conductive via and the thermal conductive via.

10. The semiconductor device structure as claimed in claim 8, further comprising a gate stack between the substrate and the thermal conductive element, wherein the gate stack is substantially aligned with the thermal conductive via.

11. A semiconductor device structure, comprising:
- a substrate;
- a resistive element over the substrate; and
- a thermal conductive element over the substrate, wherein a direct projection of the thermal conductive element on a main surface of the resistive element covers a center of the main surface of the resistive element, the direct projection of the thermal conductive element extends across a portion of a first imaginary line and a portion of a second imaginary line of the main surface, and the first imaginary line and the second imaginary line intersect at the center of the main surface.

12. The semiconductor device structure as claimed in claim 11, wherein the resistive element is closer to the substrate than the thermal conductive element.

13. The semiconductor device structure as claimed in claim 11, further comprising a second thermal conductive element over the substrate, wherein the resistive element is between the thermal conductive element and the second thermal conductive element.

14. The semiconductor device structure as claimed in claim 13, wherein a direct projection of the second thermal conductive element on the main surface of the resistive element extends across a portion of a third imaginary line and a portion of a fourth imaginary line of the main surface, the third imaginary line is perpendicular to the fourth imaginary line, and the third imaginary line and the fourth imaginary line intersect at the center of the main surface.

15. The semiconductor device structure as claimed in claim 11, wherein the resistive element is electrically isolated from the thermal conductive element.

16. A semiconductor device structure, comprising:
- a substrate;
- a resistive element over the substrate; and
- a thermal conductive element over the resistive element, wherein a direct projection of the thermal conductive element on a main surface of the resistive element extends across a portion of a first imaginary line and a portion of a second imaginary line of the main surface, and the first imaginary line and the second imaginary line intersect at a center of the main surface.

17. The semiconductor device structure as claimed in claim 16, further comprising a second thermal conductive element over the substrate, wherein the resistive element is between the thermal conductive element and the second thermal conductive element.

18. The semiconductor device structure as claimed in claim 17, wherein a direct projection of the second thermal conductive element on the main surface of the resistive element extends across a portion of the first imaginary line and a portion of the second imaginary line of the main surface.

19. The semiconductor device structure as claimed in claim 17, wherein the thermal conductive element is electrically isolated from the second thermal conductive element.

20. The semiconductor device structure as claimed in claim 16, wherein the thermal conductive element extends across an edge of the resistive element.

* * * * *